United States Patent [19]

Yagyu

[11] Patent Number: 5,086,218
[45] Date of Patent: Feb. 4, 1992

[54] PHOTO SENSOR AND ITS MANUFACTURING METHOD AND AN IMAGE READING APPARATUS HAVING THIS PHOTO SENSOR

[75] Inventor: Mineto Yagyu, Sagamihara, Japan

[73] Assignee: Canon Kabushiki Kaisha, Tokyo, Japan

[21] Appl. No.: 700,898

[22] Filed: May 13, 1991

Related U.S. Application Data

[60] Continuation of Ser. No. 607,047, Oct. 31, 1990, abandoned, which is a division of Ser. No. 204,520, Jun. 9, 1988, abandoned.

[30] Foreign Application Priority Data

Jun. 12, 1987 [JP] Japan .................. 62-146374
Nov. 13, 1987 [JP] Japan .................. 62-285617

[51] Int. Cl.⁵ ............................................. H01J 40/14
[52] U.S. Cl. ................................. 250/208.1; 358/494
[58] Field of Search ............... 250/208.1, 211 R; 357/30 D, 30 H, 30 Q; 358/213.11, 213.13, 494

[56] References Cited

U.S. PATENT DOCUMENTS 4,149,197  4/1979  Kos et al. ............... 250/208.1
4,691,244  9/1987  Cannella ............... 358/213.11
4,826,777  5/1989  Ondris ..................... 250/208.1

Primary Examiner—David C. Nelms
Assistant Examiner—Khaled Shami
Attorney, Agent, or Firm—Fitzpatrick, Cella, Harper & Scinto

[57] ABSTRACT

There is provided an image reading apparatus comprising: an opaque layer formed on a transparent insulative substrate; an insulative layer arranged on the opaque layer; photoelectric converting elements arranged on the insulative layer; and a transparent insulative protective layer formed on the photoelectric converting elements. The transparent insulative protective layer is formed as a multilayer structure and has a transparent conductive layer or an opaque conductive layer having a window which is samdwiched by the transparent insulative protective layer. With this apparatus, the transparent conductive layer does not directly come into contact with the surface of an original, so that the conductive layer is not abraded by the rubbing by the paper. An inconvenience due to the generation of the electrostatic charges is fairly eliminated. The reliability is increased.

9 Claims, 9 Drawing Sheets

PHOTO SENSOR AND ITS MANUFACTURING METHOD AND AN IMAGE READING APPARATUS HAVING THIS PHOTO SENSOR

This application is a continuation of application Ser. No. 07/607,047 filed Oct. 31, 1990 which is a Divisional of Ser. No. 07/204,520 filed June 9, 1988, both of which are now abandoned.

BACKGROUND OF THE INVENTION

1. Field of the Invention

The present invention relates to an image reading apparatus and, more particularly, to an image reading apparatus suitable for use in facsimile apparatus, image reader, digital copier, or the like in which a one-dimensional line sensor corresponding to a width direction of an original is provided and the image information is read while relatively moving the original whose image is to be read in the close contact relation with this line sensor.

2. Related Background Art

Hitherto, as such a kind of image reading apparatus which is called a contact type, there have been manufactured many various kinds of apparatuses in which the image on an original is projected onto a photo sensor having photoelectric converting elements onto a group of such photo sensors by using a rod lens array, a convergent fiber, or the like, thereby reading the original image.

On the other hand, in recent years, there has been developed an image reading apparatus of the type in which for the purpose of reduction in costs, further miniaturization, and the like, the rod lens array, convergent fiber, or the like is not used but a thin transparent protective layer is coated onto the photo sensor section and the original image is read while moving the original in close contact relation with the transparent protective layer on the photo sensor.

FIG. 1A shows an example of such a kind of conventional image reading apparatus. In the diagram, a photoelectric converting element section 1 is formed on an opaque layer 3 formed on a transparent substrate 2. A light L is irradiated from a light source 4 arranged on the back surface side of the substrate 2 and enters through a window portion (portion on which the opaque layer 3 is not formed) 5. The light L is reflected by the surface of an original P and received by the photoelectric converting element section 1. The following functions are required for a transparent protective layer 20: the irradiation of an enough amount of light onto the upper surface of the photoelectric converting element; the protection and stability of the semiconductor layer surface and electrode section on the upper surface of the photoelectric converting element; the prevention of deterioration in resolution which is caused by scratches and dusts due to an original or the like; and the like. However, the transparent protective layer 20 generally has a high insulative property. Therefore, when an original having image information to be read moves on the protective layer in close contact relation therewith, electrostatic charges are generated, causing inconveniences such as level shift of the signal, malfunction of a signal processing section, and the like.

Therefore, in the conventional techniques, for example, as shown in FIG. 1-B, an electrostatic shielding layer 21 made of ITO, SnO$_2$, or the like is formed on the original contacting surface on the protective layer 20 and the potentials are held at a constant value, thereby electrically shielding the photoelectric converting element section and preventing an adverse influence by the generation of the electrostatic charges.

Or, as disclosed in U.S. Pat. No. 4,691,243 or U.S. Pat. No. 4,691,244, there has been proposed a method whereby the electrostatic shielding layer 21 is directly provided between a photoelectric converting layer 14' and the protective layer 20 and the potentials are held at a constant value, thereby preventing an adverse influence by the generation of the electrostatic charges (refer to FIG. 1-C).

However, in the conventional structure such that the electrostatic shielding layer directly comes into contact with the surface of an ordinary original as mentioned above, scratches are easily caused on the electrostatic shielding layer by the original and dusts and the electrostatic shielding layer is abraded. Thus, not only the function for a countermeasure of the electrostatic charges deteriorates but also an amount of light which is irradiated onto the photoelectric converting layer becomes unstable or the like. The function as an image reading apparatus is aversely influenced.

On the other hand, in the structure such that the electrostatic shielding layer is directly formed between the photoelectric converting layer and the protective layer, the photoelectric converting layer cannot be electrically mechanically protected, so that such a structure cannot be substantially used.

Therefore, unless all of the foregoing electrical, optical, and mechanical problems can be solved, the complete contact type image reading apparatus is not realized.

SUMMARY OF THE INVENTION

It is an object of the present invention to provide an image reading apparatus in which the inconveniences by the generation of the electrostatic charges are eliminated by conductive layer for electrostatic shielding provided among a plurality of transparent protective layers, thereby enabling image information to be stably read.

Another object of the invention is to provide an image reading apparatus with a structure such that electrostatic shielding conductive layers are provided among a plurality of transparent protective layers and these conductive layers do not directly come into contact with an original and photoelectric converting elements, in which the abrasion of the conductive layers due to the rubbing by a paper and the deteriorations in the function for a countermeasure of the electrostatic charges in association with such an abrasion, in the optical stability, and in the function to protect the photoelectric converting elements can be eliminated by this structure, and the high reliability is obtained.

Still another object of the invention is to provide a photo sensor having photoelectric converting elements arranged on a substrate and a transparent insulative protective layer formed on the photoelectric converting elements, wherein the transparent insulative protective layer is formed as a multi-layer structure and this photo sensor has electrostatic shielding layers sandwiched among the transparent insulative protective layers.

Still another object of the invention is to provide an image reading apparatus having a photo sensor comprising: an opaque layer formed on a transparent insulative substrate; an insulative layer arranged on the opaque layer; photoelectric converting elements arranged on the insulative layer; and a transparent insulative protective layer formed on the photoelectric converting elements, wherein the transparent insulative protective layer is formed as a multi-layer structure and there is provided a transparent conductive layer or an opaque conductive layer having a window which is held at a constant potential and which is sandwiched by the transparent insulative protective layers.

Still another object of the invention is to provide a method of manufacturing a photo sensor in which the potential of the electrostatic shielding layer can be simply held at a constant value.

Still another object of the present invention to provide a method of manufacturing a photo sensor having electrostatic shielding layers, comprising the steps of:

(a) forming photoelectric converting elements onto a substrate;

(b) forming a protective layer onto the photoelectric converting elements;

(c) preparing a microsheet glass and forming electrostatic shielding layers onto a first surface of the glass, a part of a second surface on the side opposite to the first surface, and at least one edge surface which continues to the second surface; and (d) adhering the first surface formed with the electrostatic shielding layer onto the protective layer.

DETAILED DESCRIPTION OF THE PREFERRED EMBODIMENTS

The present invention will be described in detail hereinbelow with reference to the drawings.

Figure 1A:
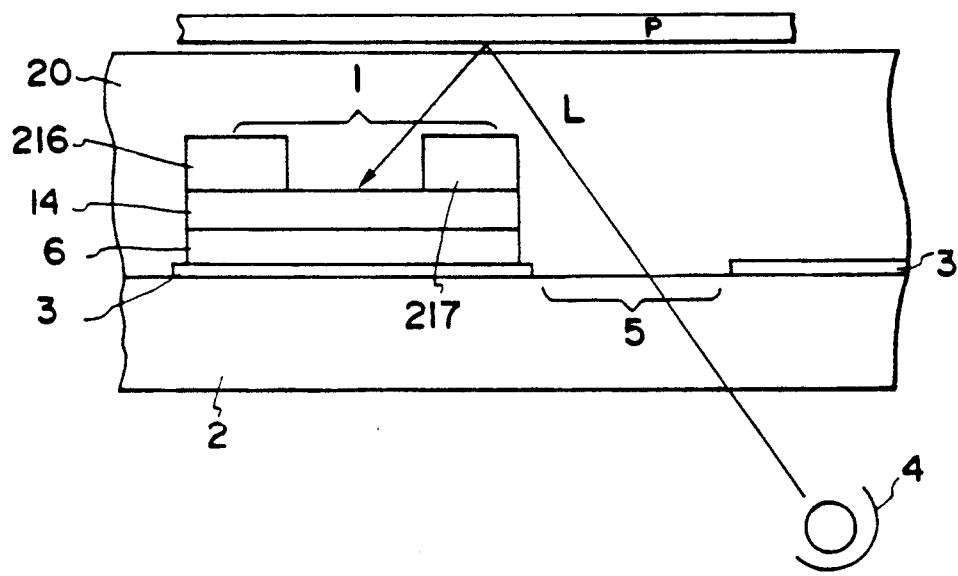
FIGS. 1-A, 1-B, and 1-C are explanatory diagrams schematically showing examples of conventional image reading apparatuses.
Figure 1B:
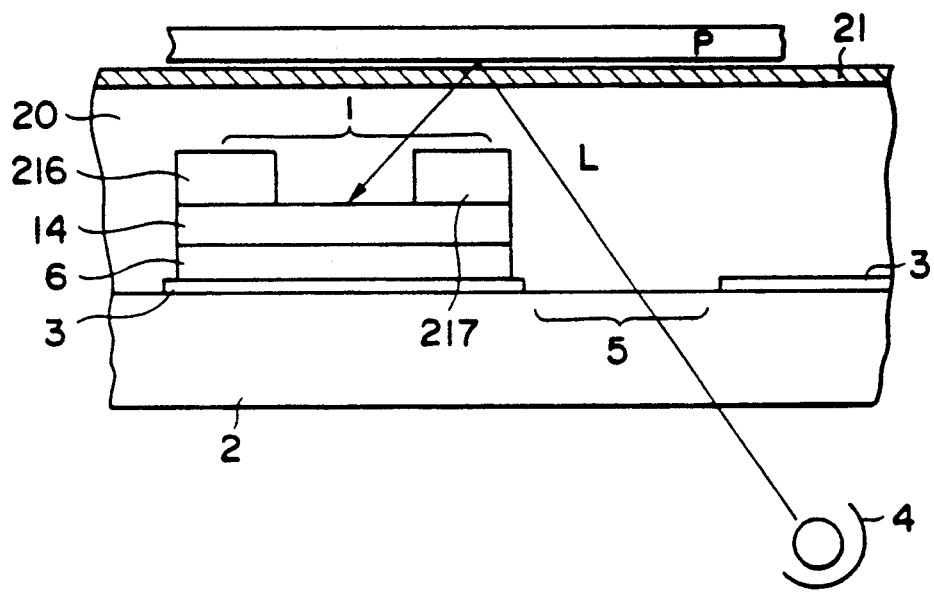
Figure 1C:
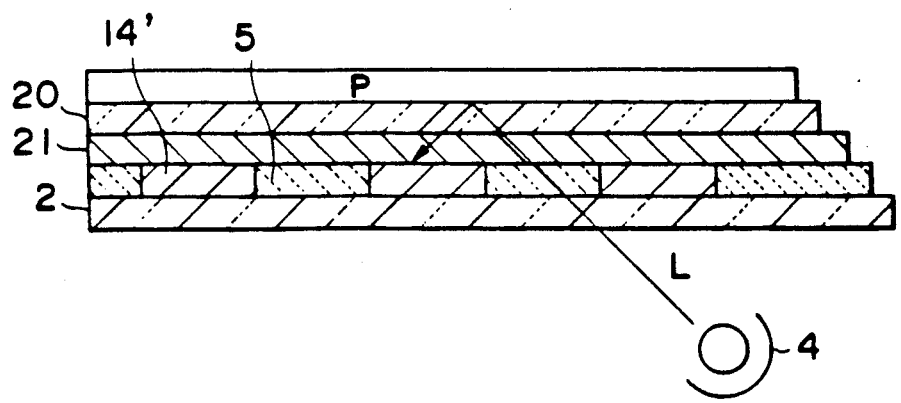
Figure 2A:
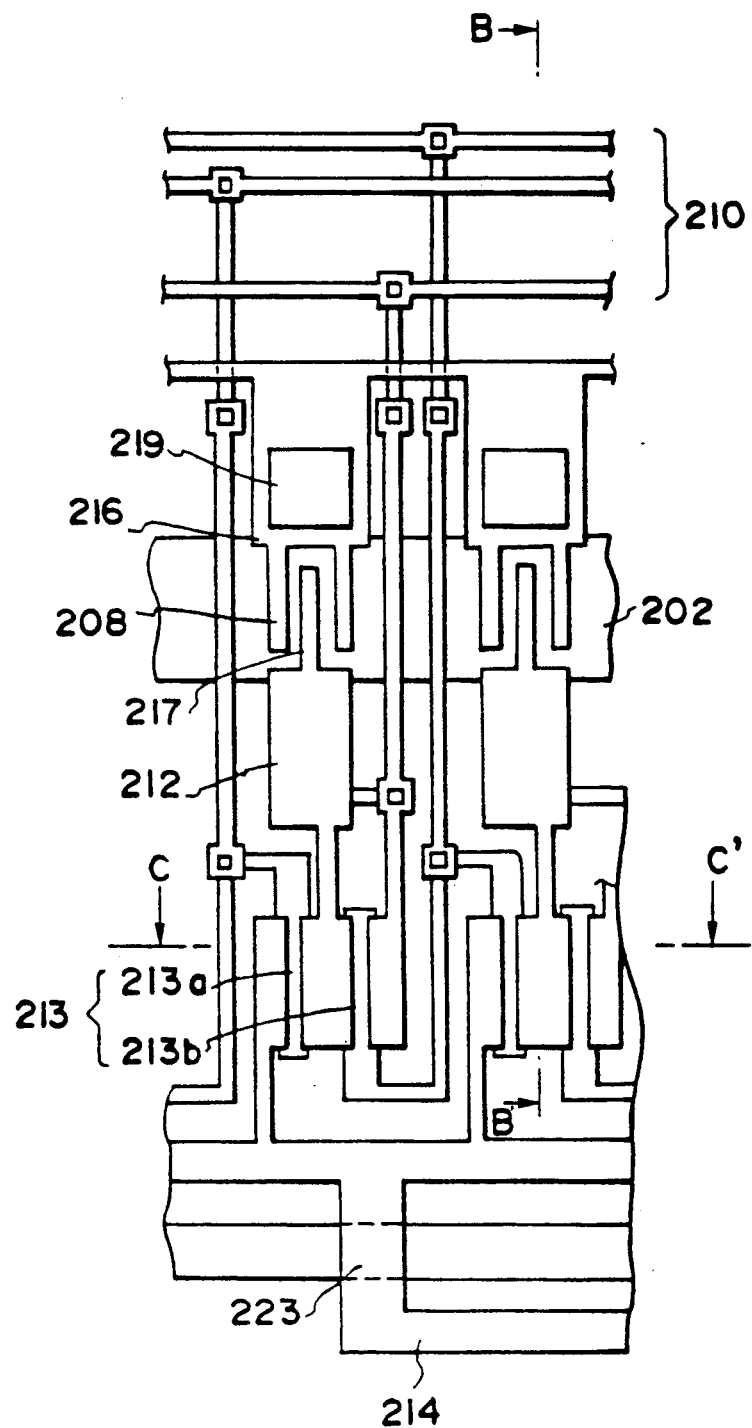
FIG. 2A is a schematic plan view showing the first embodiment of an image reading apparatus according to the present invention of the type in which a photo sensor section, a charge storage section, a switch section, and the like are integrally formed.
Figure 2B:
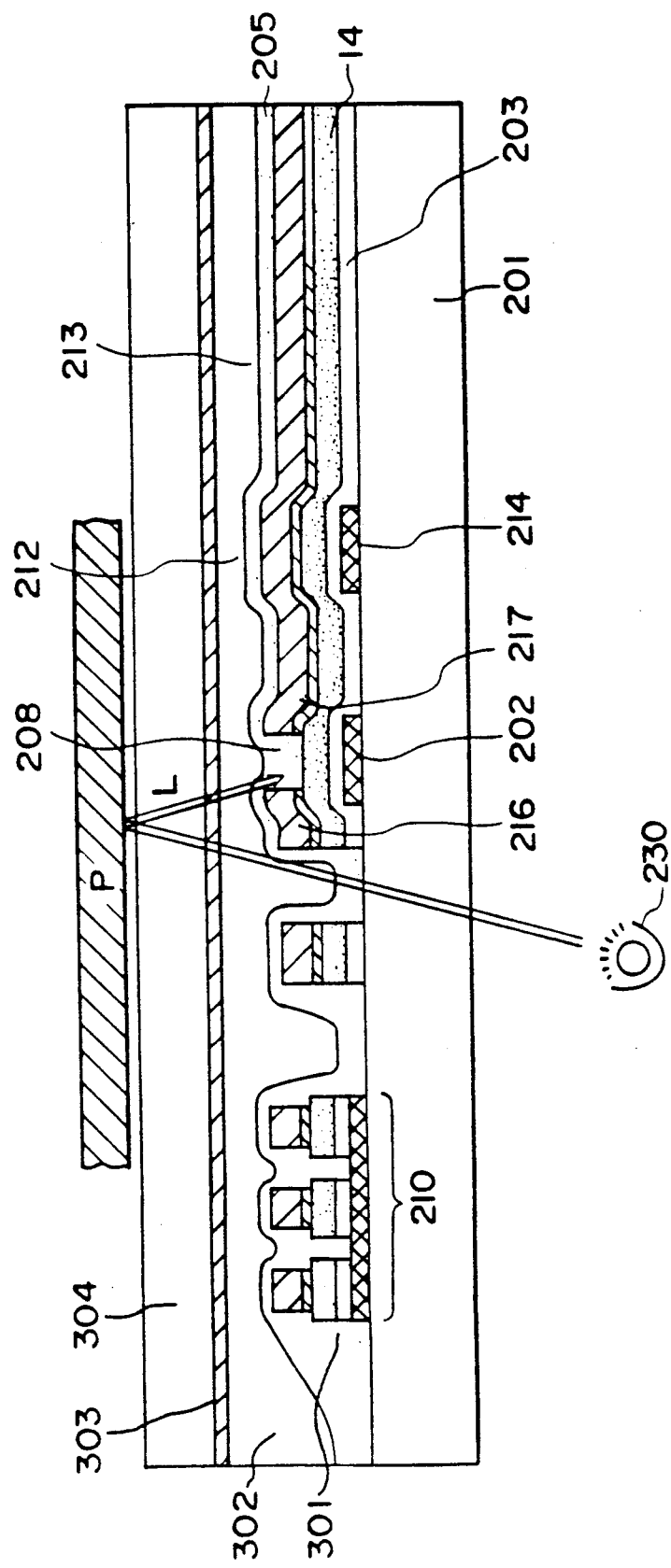
FIG. 2B is a schematic cross sectional view taken along the line B—B' in FIG. 2A.
Figure 2C:
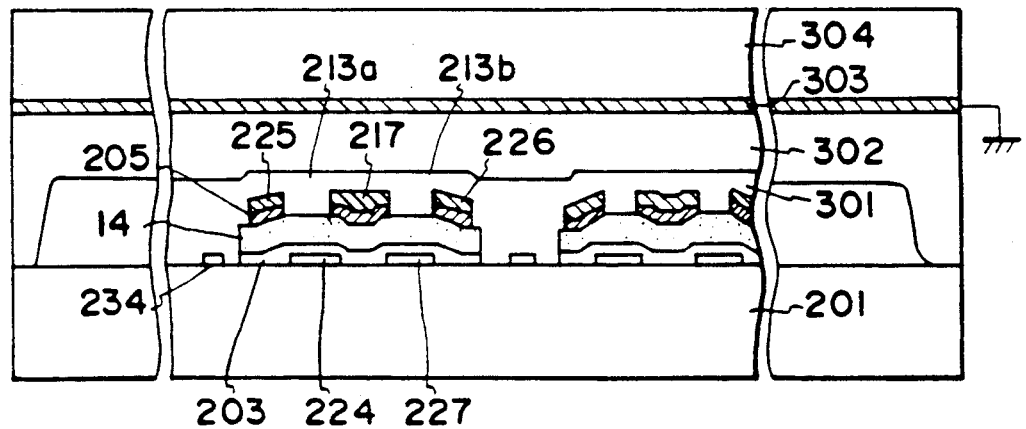
FIG. 2C is a schematic cross sectional view o taken along the line C—C' in FIG. 2A.

FIG. 2 is a schematic explanatory diagram showing the portion corresponding to two bits of an image reading apparatus of the present invention. FIG. 2A shows a plan view, FIG. 2B is a cross sectional view taken along the line B—B' in FIG. 2A, and FIG. 2C is a cross sectional view taken along the line C—C' in FIG. 2A.

In this embodiment, there is shown an image reading apparatus with the structure such that a photoelectric converting element section, a storage capacitor section, switching thin film transistor section (hereinafter, abbreviated to a TFT section), and a wiring matrix section are integrally formed on the same substrate. Although FIG. 2 shows the image reading apparatus corresponding to two bits, the actual image reading apparatus forms a one-dimensional line sensor by arranging a plurality of portions each corresponding to one bit in a line on the substrate.

For example, assuming that the resolution is set to 8 lines/mm for 216 mm corresponding to the A4 size in the width direction of the original P (in the direction perpendicular to the moving direction of the original P), 1728 photoelectric converting element sections are arranged.

In the embodiment, the photoelectric converting element section, capacitor section to store an output of the photoelectric converting element section, switch section for allowing the charges stored in the capacitor section to be transferred and signal processed, necessary wiring pattern, and the like are formed on the substrate by the same manufacturing step.

In FIGS. 2A to 2C, reference numeral 201 denotes a transparent substrate; 210 is a matrix wiring section; 208 a photoelectric converting element section; 212 a charge storage section; 213 a switch section including a transfer switch 213a and a discharge switch 213b to reset the charges stored in the charge storage section 212; 214 a wiring to connect a signal output of the transfer switch 213a to a proper signal processing section; and 223 a load capacitor to store the charges which are transferred by the transfer switch 213a and to read out them.

In the embodiment, a photoelectric converting layer is used as the photoelectric converting element section 208 and a photoconductive semiconductor layer 14 consisting of A-Si:H is used as a semiconductor layer constituting the transfer switch 213a and discharge switch 213b. A silicon nitride film (SiNH), $Si_3N_4$, or the like by the glow discharge is used as an insulative layer 203.

In FIG. 2A, for simplicity of the drawing, only the electrode wirings in two upper and lower layers are shown and the photoconductive semiconductor layer 14, insulative layer 203, a protective layer section 300 (301 to 304) are not shown.

On the other hand, the photoconductive semiconductor layer 14 and insulative layer 203 are formed in the photo sensor section 208, charge storage section 212, transfer switch 213a, and discharge switch 213b and are also formed between the upper layer electrode wirings and the substrate. Further, an A-Si:H layer 205 which is doped to n+ is formed at the boundary surface between the upper electrode wirings and the photoconductive semiconductor layer, thereby obtaining an ohmic junction.

On the other hand, in the wiring pattern of the line sensor in the embodiment, all of the signal paths which are output from each sensor section are wired so as not to cross the other wirings. Thus, the crosstalks among the signal components and the generation of the induction noises from the gate electrode wirings are prevented.

In the photoelectric converting element·section 208, reference numerals 216 and 217 denote upper layer electrode wirings. The light is irradiated from a light source 230 arranged on the side near the switch section 213 when it is seen from the image reading position. The light from the light source 230 enters through an incident window 219 and reflected by the original surface. The reflected light changes the conductivity of the photoconductive semiconductor layer 14 made of A-Si:H, thereby changing a current flowing between the upper layer electrode wirings 216 and 217 which face like a comb. Reference numeral 202 denotes a light shielding layer made of metal or the like.

The charge storage section 212 comprises: the lower layer electrode wiring 214; dielectric materials of the insulative layer 203 and photoconductive semiconductor layer 14 formed on the lower layer electrode wiring 214; and a wiring which is formed on the semiconductor layer 14 and continues to the upper layer electrode wiring 217. The structure of the charge storage section 212 is the same as that of what is called an MIS (Metal-Insulator-Semiconductor) capacitor. Although the bias condition can be set to the positive or negative bias, by always setting the lower layer electrode wiring 214 to the negative bias condition, the stable capacitance and frequency characteristic can be obtained.

FIG. 2C shows the switch section 213 of the TFT structure including the transfer switch 213a and discharge switch 213b. The transfer switch 213a comprises: a lower layer electrode wiring 224 serving as a gate electrode (the wiring 224 also has the light shielding function for the switch 213a); the insulative layer 203 serving as a gate insulative layer; the photoconductive semiconductor layer 14; an upper layer electrode wiring 225 serving as a source electrode; the upper layer electrode wiring 217 serving as a drain electrode; and the like. The gate insulative layer and photoconductive semiconductor layer of the discharge switch 213b are the same layers as the insulative layer 203 and photoconductive semiconductor layer 14. The source electrode corresponds to the upper layer electrode wiring 217. The gate electrode corresponds to a lower layer electrode wiring 227 (which also functions as a light shielding corresponds to an upper layer electrode wiring 226. A lower layer wiring 234 is connected to the gate electrode of the transfer switch 213a.

As mentioned above, the n+ layer 205 of A-Si:H exists on the boundary surfaces among the upper layer electrode wiring 217, 225, and 226 and the photoconductive semiconductor layer 14, thereby forming the ohmic contact.

Three protective layers are provided on and over the photoelectric semiconductor layer 14. First, the first passivation layer 301 to mainly protect and stabilize the surface of the semiconductor layer is formed on the upper layer electrode. The transparent insulative layer 304 having a high hardness to protect the whole apparatus from scratches by the original or the like is formed on the uppermost portion which directly comes into contact with the original. The transparent insulative layer 304 is called an abrasion resistance layer. Further, the second passivation layer 302 to improve both of the close contacting property and the moisture resistance is formed between the first passivation layer and the abrasion resistance layer. In addition, the electrostatic shielding layer 303 as an electrostatic charges countermeasure layer is formed between the second passivation layer and the abrasion resistance layer.

In the embodiment, the first passivation layer 301 is made of a polyimide system resin, a polyamide system resin, SiN, SiO$_2$, or the like. The second passivation layer 302 is formed by coating an epoxy system resin. The transparent insulative layer 304 is made of microsheet glass having a thickness of about 50 μm. The electrostatic charges countermeasure layer 303 consists of a transparent conductive layer of ITO or the like which is formed on the back surface of the transparent insulative layer 304 by the evaporating deposition or the like. The transparent conductive layer 303 is held at a constant potential by arranging a conductive material between the transparent conductive layer and what is called a ground electrode on the substrate 201.

In the side edge surface portion of the sensor, the first passivation layer 301 is completely covered by the second passivation layer 302, so that the moisture resistance and adhesive property are improved.

Further, even for the charge storage section and the function element section such as transfer switch or the like, the adverse influences by the electrostatic charges can be prevented, so that the malfunction of the switching and the like can be also prevented.

Embodiment 2

Figure 3A:
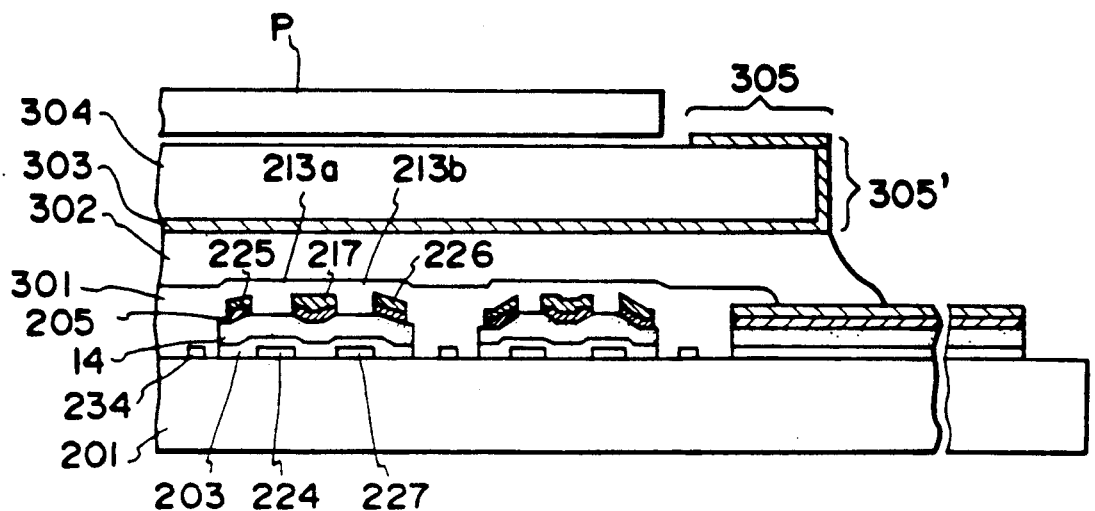
FIGS. 3A and 3B are a schematic cross sectional view and a schematic perspective view showing the second embodiment of an image reading apparatus according to the invention.
Figure 3B:
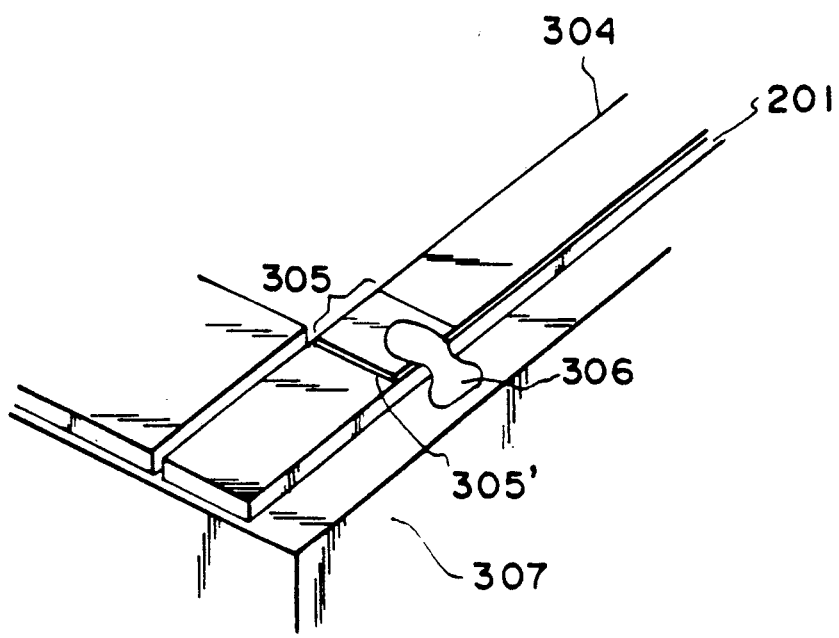
Figure 4:
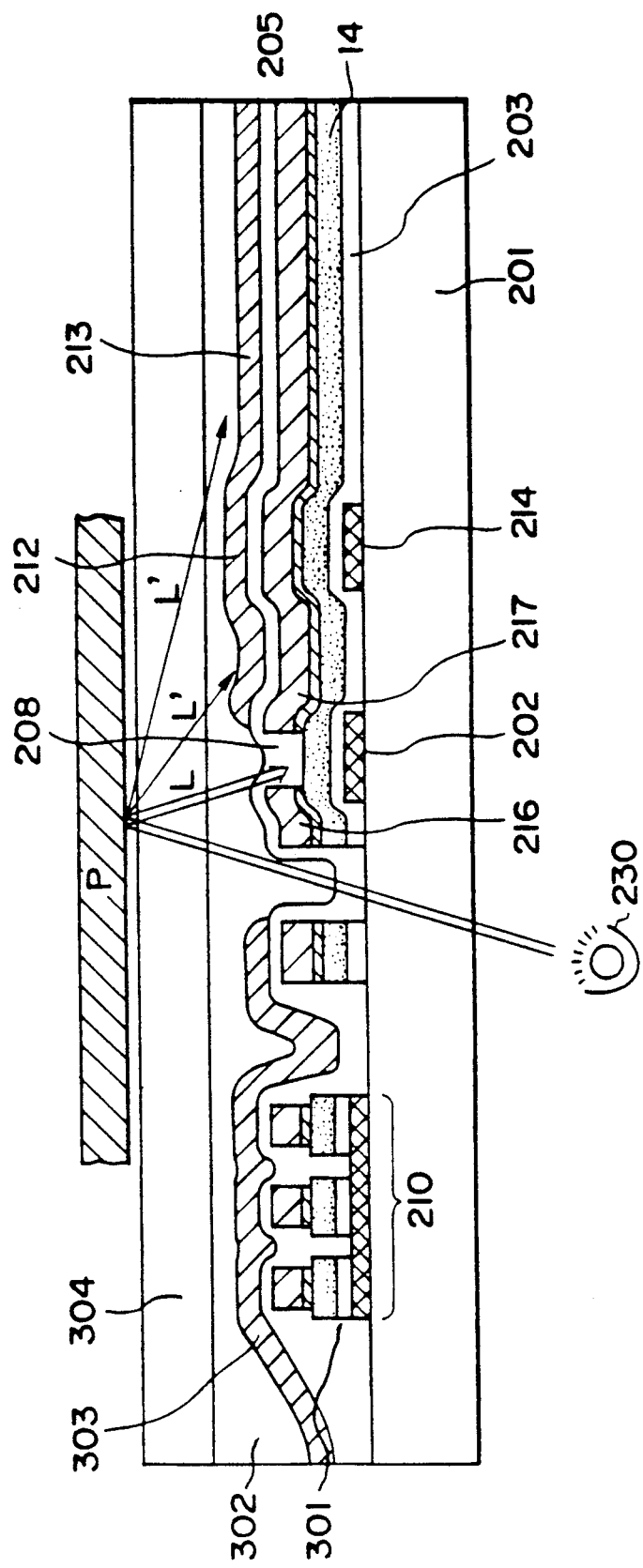
FIG. 4 is a schematic cross sectional view showing the third embodiment of an image reading apparatus according to the invention.

FIGS. 3A and 3B are a schematic cross sectional view and a schematic perspective view showing the second embodiment of an image reading apparatus of the present invention. FIG. 3A shows the portion corresponding to FIG. 2C.

In this embodiment, transparent conductive layers 303, 305, and 305' consisting of ITO or the like are formed as electrostatic shielding layers for an electrostatic charges countermeasure in the regions which do not directly come into contact with an original with respect to the surface of the transparent insulative layer 304 corresponding to the photoelectric converting element section, the side surface of the edge portion, and the surface which faces the original. In this embodiment, the first passivation layer made of a polyimide resin is formed on the photoelectric converting elements provided on the substrate. An epoxy resin as the second passivation layer is coated on the first passivation layer. Further, the electrostatic shielding layer is formed on the microsheet glass by using a method, which will be explained hereinlater, and is adhered through the epoxy resin. The transparent conductive layers 305 and 305' function as connecting electrodes to keep the transparent conductive layer 303 to a constant potential. The connecting electrodes 305 and 305' and the electrode to keep the transparent conductive layer 303 at a constant potential, what is called the ground electrode are electrically connected by coating a conductive resin 306 onto the connecting electrodes 305 and 305' and onto a conductive casing 307 which is held to the constant potential. The other constitution is similar to FIG. 3. In this manner, it is possible to easily ground with the adhesive property held.

To realize the above constitution, there is needed a device in a film forming method of the transparent conductive layer 303 onto the microsheet glass constituting the transparent insulative layer 304. According to an ordinary method of evaporation depositing, sputtering, electron beam, or a method whereby an organic metal compound is dipped and thereafter, it is burned, it is difficult to continuously form the layer of the transparent conductive layer onto the back surface of the microsheet glass and a part of the upper surface thereof. However, in this embodiment, the above structure is accomplished by using the metal fog method (refer to JP-B-55-15545) as a kind of the CVD method.

According to the method of evaporation depositing, sputtering, electron beam, or dipping, the film thickness in the cut corner portion of the glass becomes extremely thin due to the influences by the rectilinearity, gravity, surface tension, and the like of the evaporated particles, and the electrical connection becomes unstable. On the other hand, when the thickness of the glass is so thick as to be about 1 mm, by chamfering the corner portion of the glass, the reduction of the film thickness can be also decreased. However, it is difficult to apply this chamfering method to the microsheet glass having a thickness of about 50 μm.

On the other hand, according to the metal fog method, the fluid in which the organic metal compound as a base material of ITO is dissolved is converted into a mist consisting of microparticles and deposited onto the glass substrate. Therefore, by adjusting the setting position of the glass substrate, progressing direction, and progressing speed, the transparent conductive layer 303 can be uniformly formed on the surfaces around the edge of the microsheet glass. Thus, the electrostatic shielding layer having the stable electrical connection can be easily formed.

As a method of connecting the connecting electrodes 305 and 305' and ground electrode, there is known a method whereby a conductive rubber is mechanically pressed, a method by soldering, or the like as well as the method in the embodiment.

As described above, according to the second embodiment of the invention, the electrostatic shielding layer and ground electrode formed between the second passivation layer and the transparent insulative layer 304 can be easily connected and the potential of the electrostatic shielding layer can be easily held to a constant value.

On the other hand, since there is no need to perform the electrical connection at the side surface in the edge portion sandwiched by the second passivation layer and the transparent insulative layer, the entering of the water from the edge portion side surface can be prevented and the adhesive property and moisture resistance can be further improved.

As described above, according to the structures in the first and second embodiments, even if the electrostatic charges are generated on the microsheet glass due to the contact with the original, since the photo sensor section and the function element sections such as capacitor section and thin film transistor section are electrically shielded by the transparent conductive layer. Accordingly, the influences such as signal level shift, malfunction, breakage of the element, or the like on the element by the electrostatic charges can be eliminated to the level which does not practically cause a problem.

Moreover, since the electrostatic shielding layer is provided between the protective layers, the photoelectric converting layer and electrostatic shielding layer can be electrically mechanically protected and the electrostatic shielding layer is not abraded. Thus, the optically excellent image reading apparatus can be obtained.

Embodiment 3

In the first and second embodiments, the electrostatic shielding layer as the electrostatic charges countermeasure layer has been made of a transparent conductive material of ITO or the like. However, this layer can be also made of an opaque conductive material having a window.

Figure 5:
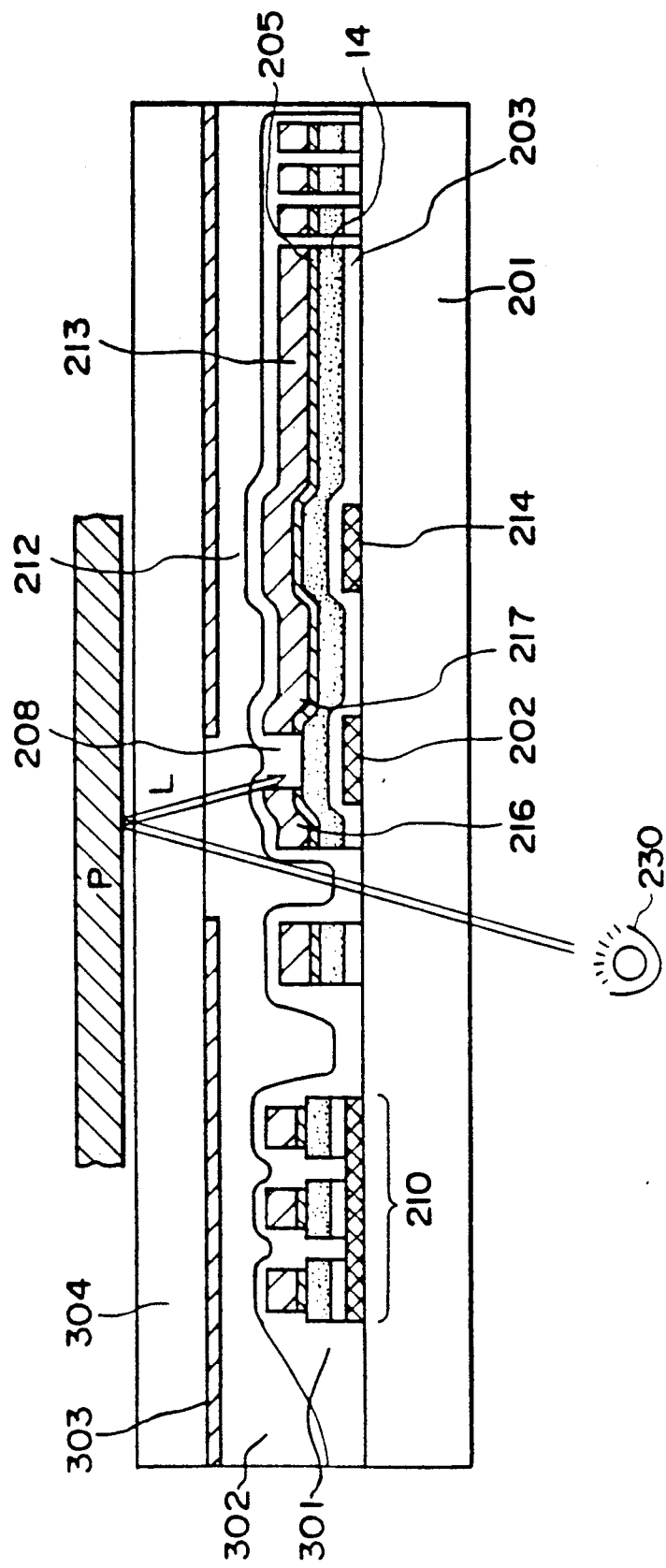
FIG. 5 is a schematic cross sectional view showing the fourth embodiment of an image reading apparatus according to the invention.

FIG. 5 shows the third embodiment of the invention regarding such an example. This diagram shows the portion corresponding to FIG. 2B and the parts and components indicated at reference numerals 201 to 214 and 14 are similar to those shown in the first embodiment.

In the third embodiment, the first passivation layer 301 is mainly formed on the upper layer electrode. The opaque conductive layer 303 is formed on the first passivation layer 301. The second passivation layer 302 is formed on the opaque conductive layer 303. The abrasion resistance layer 304 is formed on the passivation layer 302. The first and second passivation layers are provided for the same purpose in the first embodiment. The opaque conductive layer is not formed in the portion corresponding to the optical path L along which the light emitted from the light source is irradiated onto the original and the light reflected by the original reaches the photo sensor section, thereby forming what is called a window.

In this embodiment, the first passivation layer 301 is formed by polyimide silicone nitride, or silicone dioxide. The opaque conductive layer 303 is made of a metal film of Al, Cr, or the like. The passivation layer 302 is formed by an epoxy system resin. The abrasion resistance layer 304 consists of a microsheet glass having a thickness of about 50 μm.

With the structure of the third embodiment, the effects similar to those in the first and second embodiments are derived. Further, since the electrostatic shielding layer is opaque and is located near the elements in the lower portion, a preferable effect as a contact type image reading apparatus is derived.

In general, the light irradiated onto the original is irregularly reflected and the reflected light progresses not only in the direction of the photo sensor section but also in the direction of the capacitor section or switching thin film transistor section, so that there is a case where the leakage light causes the signal level shift or malfunction. Particularly, when the image reading density increases and the distance between the elements decreases, this tendency is enhanced. However, in the structure in the third embodiment, since the opaque conductive layer as the electrostatic charges countermeasure layer shields unnecessary reflected light L', so that this layer also has the function to prevent the malfunction of the thin film transistor which hates the light irradiation. Further, since the electrode layer which is held to a constant potential faces the upper layer electrode of each element through only the first passivation layer, the capacitive component is newly produced between the upper layer electrode and the constant potential. Thus, there is an advantage such that the signal crosstalks between the adjacent bits or the like are reduced. Moreover, in the capacitor section which occupies a large area, the opposite electrode which is held to a constant potential is newly produced on the upper layer electrode, so that there is a large advantage in terms of the reduction in area and the high density. Namely, as advantages of the opaqueness, the unnecessary irregular reflected light is shielded. As an advantage of the close arrangement of the opaque conductive layer from the elements, the crosstalks are reduced and the area of the capacitor section is decreased. Since the transparency and opaqueness of the electrostatic shielding layer and the arranging position thereof are the elements which can be independently selected. Therefore, it is sufficient to select the suitable structure of the electrostatic shielding layer in accordance with a desired advantage.

Embodiment 4

FIG. 5 shows a schematic cross-sectional view of a sensor in the embodiment. In this embodiment, an opaque conductive layer made of Al, Cr, or the like is provided as an electrostatic shielding layer between the abrasion resistance layer consisting of a microsheet glass and the second passivation layer made of an epoxy system resin.

An illumination window is formed in the opaque conductive layer. The fourth embodiment is constituted in a manner similar to the Embodiment 2 except that the opaque conductive layer having the illumination window is used as an electrostatic shielding layer.

As described above, by providing the opaque conductive layer between the abrasion resistance layer and the second passivation layer, the following advantages are obtained. (1) The connection to the ground electrode can be easily performed. (2) The moisture resistance and adhesive property are improved. (3) The adverse influences by the unnecessary reflected light can be prevented.

Although the above embodiment has been described by using what is called the TFT type sensor as the photoelectric converting element, the invention is not limited to the type of photoelectric converting element but can be also applied to other types such as photoconductive type photodiode type, phototransistor type, sandwiching type, and the like.

Figure 6:
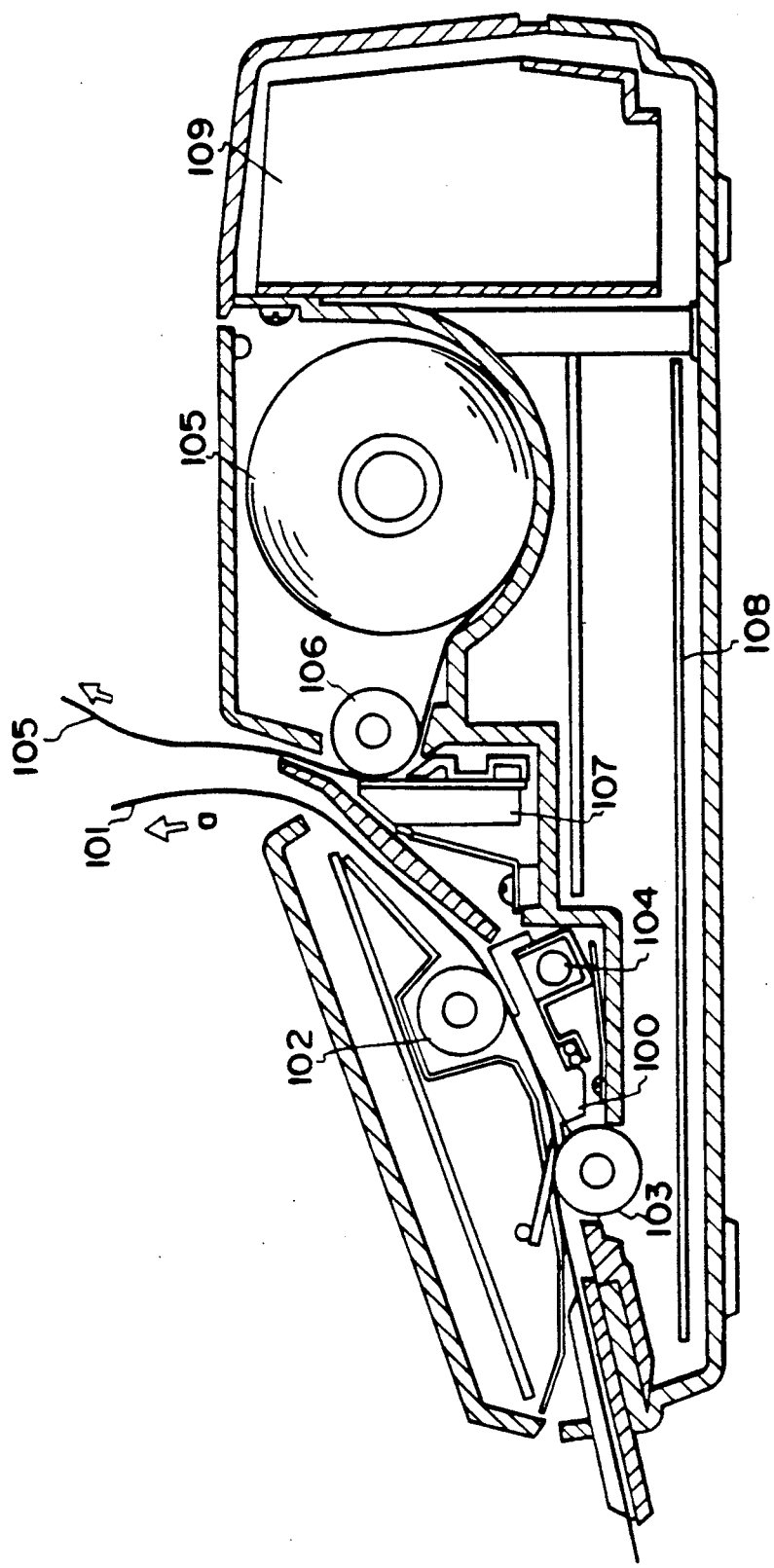
FIG. 6 is a schematic side elevational view with parts cut away of a facsimile apparatus using the image reading apparatus according to the invention.

FIG. 6 is a schematic arrangement diagram of a facsimile apparatus using the image reading apparatus according to the invention.

In the diagram, when an original image is transmitted, an original 101 is pressed onto a contact type image sensor 100 by a platen roller 102 and moved in the direction of an arrow a by the platen roller 102 and a feed roller 103. The surface of the original is illuminated by a xenon lamp 104 as a light source. The reflected light from the original is input to the sensor 100 and converted into the electric signal corresponding to the image information of the original and transmitted.

In the reception mode, a recording paper 105 is conveyed by a platen roller 106 and the image corresponding to the reception signal is reproduced by a thermal head 107.

The whole apparatus is controlled by a controller of a system control substrate 108. Electric powers are supplied from a power source 109 to each drive system and each circuit.

By applying the image reading apparatus of the embodiment as a contact type image sensor to such a facsimile apparatus, it is possible to provide a facsimile apparatus whose costs and size are further reduced.

As described in detail above, according to the present invention, there is provided a simple structure such that the transparent conductive layer or opaque conductive layer having a window is formed between the transparent protective layers of a multilayer structure on the photoelectric converting element. Even by use of such a simple structure, the inconvenience due to the generation of the electrostatic charges is reduced to the level which does not practically cause any problem and at the same time, the photoelectric converting elements can be protected, abrasion of the conductive layer by the rubbing by the paper can be eliminated, and the like. Further, according to the foregoing different structure, there can be also obtained advantages such as shield of the unnecessary irregular light, reduction in crosstalks, and decrease in area of the capacitor section.

On the other hand, by using the structure of the invention, a compact photoelectric converting apparatus with the improved reliability can be provided.

What is claimed is:

1. A method of manufacturing a photo sensor having an electrostatic shielding layer comprising the steps of:
    (a) forming photoelectric converting elements on a substrate;
    (b) forming a protective layer on said photoelectric converting elements;
    (c) preparing a a sheet member and forming a conductive layer on a first surface of said sheet member, a part of a second surface on the side opposite to said first surface, at least one edge surface which continues to said first and second surfaces; and
    (d) adhering on said protective layer said first surface on which said conductive layer is formed.

2. A method according to claim 1, wherein said conductive layer is formed by a metal fog method.

3. A method according to claim 1, wherein said conductive layer comprises ITO.

4. A method according to claim 1, wherein said conductive layer comprises an opaque layer having a light transmitting portion.

5. A method according to claim 1, wherein said conductive layer comprises a metal film.

6. A method according to claim 1, wherein said protective layer comprises a resin.

7. A method according to claim 1, wherein said protective layer comprises, a layer of a material selected from the group consisting of SiN and $SiO_2$, and a resin layer disposed on said layer of material.

8. A method according to claim 1, wherein said sheet member comprises microsheet glass.

9. A method of manufacturing a photo sensor having a conductive layer comprising the steps of:
    (a) forming photoelectric converting elements on a substrate;
    (b) forming a protective layer on said photoelectric converting elements;
    (c) preparing a sheet member and forming a conductive layer on a first surface of said sheet member; and
    (d) adhering on said protective layer said first surface on which said conductive layer is formed.

* * * * *

UNITED STATES PATENT AND TRADEMARK OFFICE
CERTIFICATE OF CORRECTION

PATENT NO. : 5,086,218

DATED : February 4, 1992

INVENTOR(S) : MINETO YAGYU

Page 1 of 2

It is certified that error appears in the above-identified patent and that said Letters Patent is hereby corrected as shown below:

AT [57] ABSTRACT

"samdwiched" should read --sandwiched--.

COLUMN 1

Line 7, "Divisional" should read --division--.
Line 20, "the" should be deleted.
Line 51, "an enough" should read --a sufficient--.
Line 57, "dusts" should read --dust--.

COLUMN 2

Line 17, "dusts" should read --dust--.

COLUMN 3

Line 40, "o" should be deleted.

COLUMN 4

Line 59, "crosstalks" should read --crosstalk--.

COLUMN 5

Line 1, "reflected" should read --is reflected--.
Line 38, "shielding corresponds" should read
--shielding layer of the switch 213b).
The drain electrode corresponds--.

UNITED STATES PATENT AND TRADEMARK OFFICE
CERTIFICATE OF CORRECTION

PATENT NO.  : 5,086,218
DATED       : February 4, 1992
INVENTOR(S) : MINETO YAGYU It is certified that error appears in the above-identified patent and that said Letters Patent is hereby corrected as shown below:

COLUMN 8

Line 51, "crosstalks" should read --crosstalk--.
Line 52, "are" should read --is--.
Line 61, "crosstalks are" should read --crosstalk is--.
Line 65, "selected.  There-" should read
         --selected, there- --.

COLUMN 9

Line 28, "type" (1st occurrence) should read --type,--.

COLUMN 10

Line 10, "crosstalks," should read --crosstalk,--.
Line 22, "a" (second occurrence) should be deleted.
Line 42, "comprises," should read --comprises--.

Signed and Sealed this

Tenth Day of August, 1993

Attest:

MICHAEL K. KIRK

*Attesting Officer*    *Acting Commissioner of Patents and Trademarks*